US006278652B1

(12) United States Patent
Katsuhisa

(10) Patent No.: US 6,278,652 B1
(45) Date of Patent: Aug. 21, 2001

(54) INPUT INITIAL STAGE CIRCUIT FOR SEMICONDUCTOR MEMORY

(75) Inventor: Takuji Katsuhisa, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/617,554

(22) Filed: Jul. 17, 2000

(30) Foreign Application Priority Data

Jul. 15, 1999 (JP) .................................................. 11-201854

(51) Int. Cl.$^7$ ....................................................... G11C 8/00
(52) U.S. Cl. ........................ 365/233; 365/201; 365/206; 365/236
(58) Field of Search .................................... 365/233, 201, 365/206, 236, 230.08

(56) References Cited

U.S. PATENT DOCUMENTS

| | | | |
|---|---|---|---|
| 6,115,836 | * 9/2000 | Churchill et al. | .................... 714/726 |
| 6,144,594 | * 11/2000 | McClure | .............................. 365/201 |
| 6,160,744 | * 12/2000 | Kajigaya et al. | .................... 365/200 |

* cited by examiner

Primary Examiner—Huan Hoang
(74) Attorney, Agent, or Firm—Hutchins, Wheeler & Dittmar

(57) ABSTRACT

In a semiconductor memory which includes an input initial stage circuit receiving an external clock for generating an internal clock and an internal circuit operating on the basis of the internal clock, the input initial stage circuit comprises a first inverter receiving the external clock for generating the internal clock, a second inverter receiving an output of the first inverter, and a switch transistor having a control electrode receiving a test mode signal and a main current path connected between an output of the second inverter and an input of the first inverter. This switch transistor is turned on in response to the test mode signal, so as to connect the output of the second inverter to the input of the first inverter. With this arrangement, even if the external clock applied at the time of a testing has a voltage transition which is slower than a voltage transition of an external clock applied in a normal operation of the semiconductor memory, the input initial stage circuit can generate the internal clock which correctly reflect the change of the input clock.

17 Claims, 4 Drawing Sheets

INPUT INITIAL STAGE CIRCUIT FOR SEMICONDUCTOR MEMORY

BACKGROUND OF THE INVENTION

The present invention relates to an input initial stage circuit for a semiconductor memory, and more specifically to an input initial stage circuit so configured to prevent malfunction of an internal circuit in a semiconductor memory, attributable to a parasite signal, when an external clock having a slow voltage transition is applied.

Recently, with an elevated performance of a system such as a computer operating in a digital manner, a semiconductor memory used in the digital system is required to have a high operating frequency. At present, a dominant semiconductor memory adapted for a high speed operation is comprised of a synchronous DRAM (dynamic random access memory) having an internal address count-up function, a burst operation function and an operation mode setting function.

Here, the burst operation function is that, in an operation of the synchronous DRAM, when an address is designated from an external, data of the number of bursts designated in the operation mode is continuously read or written from the value of the address. In addition, the internal address count-up function is that, in the burst operation, an internal address counter counts up from the initially set address in synchronism with a clock supplied from an external, to increment the address value by the number corresponding to the number of bursts designated in the operation mode. Furthermore, the operation mode setting function is to set the number of bursts, to set an output data delay, and to set the manner of counting up the address, in response to an external command, in the operation of the synchronous DRAM.

A basic construction of the prior art synchronous DRAM having the internal address count-up function, the burst operation function and the operation mode setting function, will be described with reference to FIG. 4, which is a block diagram illustrating a basic construction of the synchronous DRAM in accordance with the present invention. The shown synchronous DRAM comprises an input initial stage circuit 11, a flipflop (F/F) circuit 12, a logic decoder 13, an address counter 14, a memory controller 15 and a memory cell array 16, which are coupled as shown.

In the prior art synchronous DRAM, the input initial stage circuit 11 receives an external clock CLK and generates an internal clock "INTERNAL CLOCK". The internal clock is supplied to the flipflop circuit 12 and the address counter 14. The flipflop circuit 12 latches and outputs external commands φ1, φ2 and φ3 in response to the internal clock. The logic decoder 13 receives the external commands outputted from the flipflop circuit 12, and outputs various instructions including a read instruction "READ", a write instruction "WRITE", and a number-of-bursts instruction "NUMBER OF BURSTS". The address counter 14 receives an external address φ4 and counts up the internal clock to output an address "ADDRESS" to the memory controller 15. The memory controller 15 receives the address from the address counter 14 and the read instruction "READ", the write instruction "WRITE" and the number-of-bursts instruction "NUMBER OF BURSTS" from the logic decoder, and controls the memory cell array 16 to execute a reading or writing of the designated number of bursts from the designated address. Thus, under control of the memory cell controller 15, data is read from or written into the memory cell array 16 in a burst mode.

A prior art input initial stage circuit is constituted of an inverter 21, as shown in FIG. 5, which inverts an input signal to output an amplified inverted signal as an output signal.

In the above mentioned semiconductor memory, with an elevated operation speed of the semiconductor memory, the input initial stage circuit is constituted of a circuit which can operate with a high speed of for example about 1ns or less.

However, a memory simple testing apparatus used in a fabricating process for sorting and evaluating the semiconductor memories cannot generate a test signal meeting with the high speed operation, and therefore, a test signal having a slow voltage transition is used for testing the semiconductor memory.

If there was used the testing apparatus generating a test signal having a voltage transition which is slow in comparison with the operating speed of the input initial stage circuit, the input initial stage circuit generates a parasite signal composed of an unexpected short pulse, which causes a malfunction in an internal circuit of the semiconductor memory. As a result, it become impossible to verify whether or not a normal operation is executed.

Referring to FIG. 6, there is shown a timing chart illustrating a change of an input signal and an output signal of the prior art input initial stage circuit. In the input initial stage circuit constituted of the inverter 21 as shown in FIG. 5, a threshold value when an input level changes from a low level to a high level is the same as that when the input level changes from the high level to the low level. This threshold is indicated with "S" in FIG. 6.

As shown in FIG. 6, when the input signal applied to the inverter 21 monotonously increases as indicated with "A", an output signal "B" of the inverter is constant at a high level unless the level of the input signal "A" exceeds the threshold "S". When the level of the input signal "A" exceeds the threshold "S", an electric current flows in the inside of the inverter, so that the output voltage "B" of the inverter drops. At this time, the threshold of the inverter becomes high because of a power supply voltage variation in the inside of the circuit. Therefore, at a next moment, the electric current does not flow in the inverter, so that the output voltage "B" of the inverter elevates again. Then, because the electric current does not flow in the inverter, the threshold of the inverter becomes low, with the result that the electric current flows again in the inverter, and therefore, the output voltage "B" of the inverter drops again.

This phenomenon occurs repeatedly, so that the output voltage "B" of the inverter vigorously varies up and down to generate short pulses as designated with "B1" and "B2" in FIG. 6, and simultaneously, the threshold of the inverter correspondingly varies.

After this variation is repeated some times, the level of the input signal "A" becomes ceaselessly higher than the threshold "S", with the result that the output voltage "B" of the inverter is stabilized at a low level.

As mentioned above, when the voltage transition of the input signal used for testing the semiconductor memory is considerably slower than the operation speed of the input initial stage circuit of the semiconductor memory, the threshold of the input initial stage circuit varies up and down at a rate higher than the speed of the voltage transition of the input signal, because of an internal power supply voltage variation and others. As a result, in response to the monotonous change of the input signal (clock) in a single cycle, the input initial stage circuit cannot generate the output signal which correctly reflects the change of the input level, but generates a parasite signal composed of for example a plurality of repeated short pulses. Therefore, the address counter receiving the output of the input initial stage circuit erroneously counts up to consequentially generate an erroneous address, with the result that the reading operation or the writing operation of the semiconductor memory is not performed normally.

BRIEF SUMMARY OF THE INVENTION

Accordingly, it is an object of the present invention to provide an input initial stage circuit for a semiconductor memory, which has overcome the above mentioned problems of the prior art. Another object of the present invention is to provide an input initial stage circuit for a semiconductor memory, which can generate an output signal which correctly reflects the change of an input level, even if the voltage transition of a test signal applied for testing the semiconductor memory is slower than an operating speed of the input initial stage circuit, so that the verification of the operation of the semiconductor memory can be performed normally.

According to a first aspect of the present invention, there is provided an input initial stage circuit for a semiconductor memory which includes the input initial stage circuit receiving an external clock for generating an internal clock and an internal circuit operating on the basis of the internal clock, the input initial stage circuit comprising a first inverter receiving the external clock for generating the internal clock, a second inverter receiving an output of the first inverter, and a switch means connected between an output of the second inverter and an input of the first inverter, the switch means being turned on at the time of a testing, so as to connect the output of the second inverter to the input of the first inverter.

In a specific embodiment of the input initial stage circuit, the switch means comprises a transistor having a control electrode receiving a test mode signal and a main current path connected between the output of the second inverter and the input of the first inverter, and the transistor is turned on in response to the test mode signal, so as to connect the output of the second inverter to the input of the first inverter.

According to a second aspect of the present invention, there is provided an input initial stage circuit for a semiconductor memory which includes the input initial stage circuit receiving an external clock for generating an internal clock and an internal circuit operating on the basis of the internal clock, the input initial stage circuit comprising a first inverter receiving the external clock for generating the internal clock, a second inverter receiving an output of the first inverter, a first switch means connected between an output of the second inverter and an input of the first inverter, the first switch means being turned on at the time of a testing, so as to connect the output of the second inverter to the input of the first inverter, and a second switch means connected between the output of the first inverter and an input of the second inverter, the second switch means being turned on at the time of the testing, so as to connect the output of the first inverter to the input of the second inverter.

In a specific embodiment of the input initial stage circuit, the first switch means comprises a first transistor having a control electrode receiving a test mode signal and a main current path connected between the output of the second inverter and the input of the first inverter. The second switch means comprises a second transistor having a control electrode receiving the test mode signal and a main current path connected between the output of the first inverter and the input of the second inverter. In response to the test mode signal, the first transistor is turned on to connect the output of the second inverter to the input of the first inverter, and the second transistor is turned on to connect the output of the first inverter to the input of the second inverter.

In the above mentioned input initial stage circuits, the external clock applied at the time of the testing can have a voltage transition which is slower than a voltage transition of an external clock applied in a normal operation of the semiconductor memory.

In addition, the semiconductor memory can comprise an internal address count-up function counting up the internal clock for generating an address, an operation mode setting function responding to an external command latched in response to the internal clock, for setting a mode for a reading or a writing, and a burst operation function responding to the external command latched in response to the internal clock, for setting the number of bursts to be performed from a designated address for a burst reading or writing.

In the above mentioned input initial stage circuit in accordance with the first aspect of the present invention for the semiconductor memory, the first inverter receiving the external clock for generating the internal clock as an operating clock for the semiconductor memory, is added with the second inverter receiving the output of the first inverter and the switch means connected between the output of the second inverter and the input of the first inverter. At the time of the testing, this switch means is turned on so as to connect the output of the second inverter to the input of the first inverter, with the result that the output of the first inverter is fed back to the input of the first inverter through the second inverter. Namely, at the time of the testing, the feedback circuit is constituted in the input initial stage circuit, so that the input initial stage circuit operates as a hysteresis circuit.

Since the input initial stage circuit operates as the hysteresis circuit, when the level of the external clock exceeds the threshold of the input initial stage circuit, it is possible to prevent the generation of a parasite signal composed of a plurality of repeated short pulses, attributable to variation of the threshold occurring because of the internal power supply voltage variation. Therefore, even if the external clock applied for testing the semiconductor memory has a voltage transition which is slower than a voltage transition of an external clock applied in a normal operation of the semiconductor memory, the input initial stage circuit can generate the internal clock which correctly reflects the change of the input clock, without being accompanied by the parasite signal, with the result that the reading operation or the writing operation of the semiconductor memory can be performed normally.

In the above mentioned input initial stage circuit in accordance with the second aspect of the present invention for the semiconductor memory, the first inverter receiving the external clock for generating the internal clock as an operating clock for the semiconductor memory, is added with the second inverter receiving the output of the first inverter, the first switch means connected between the output of the second inverter and the input of the first inverter, and the second switch means connected between the output of the first inverter and the input of the second inverter. At the time of the testing, the first and second switch means are turned on to connect the output of the second inverter to the input of the first inverter, and to connect the output of the first inverter to the input of the second inverter, with the result that the output of the first inverter is fed back to the input of the first inverter through the second inverter. Namely, at the time of the testing, the feedback circuit is constituted in the input initial stage circuit, so that the input initial stage circuit operates as a hysteresis circuit.

Since the input initial stage circuit operates as the hysteresis circuit, when the level of the external clock exceeds the threshold of the input initial stage circuit, it is possible to prevent the generation of a parasite signal composed of a plurality of repeated short pulses, attributable to variation of the threshold occurring because of the internal power supply voltage variation. Therefore, even if the external clock applied for testing the semiconductor memory has a voltage transition which is slower than a voltage transition of an external clock applied in a normal operation of the semiconductor memory, the input initial stage circuit can generate the internal clock which correctly reflect the change of the input clock, without being accompanied by the parasite signal, with the result that the reading operation or the writing operation of the semiconductor memory can be performed normally.

Furthermore, in the normal operation of the semiconductor memory, the first and second switch means are maintained in an off condition, so that the second inverter for the feedback is separated from the output of the inverter which generates the internal clock, with the result that it is possible to prevent an input capacitance of the second inverter from being added to the output of the first inverter. Accordingly, the high speed operation of the input initial stage circuit can be ensured.

Therefore, according to a third aspect of the present invention, there is provided an input initial stage circuit for a semiconductor memory which includes the input initial stage circuit receiving an external clock for generating an internal clock and an internal circuit operating on the basis of the internal clock, the input initial stage circuit comprising a feedback circuit so that the input initial stage circuit operates as a hysteresis circuit, so as to prevent generation of a parasite signal in the internal clock, attributable to variation of a threshold occurring when the level of the external clock exceeds the threshold of the input initial stage circuit.

The above and other objects, features and advantages of the present invention will be apparent from the following description of preferred embodiments of the invention with reference to the accompanying drawings.

DETAILED DESCRIPTION OF THE INVENTION

Figure 1:
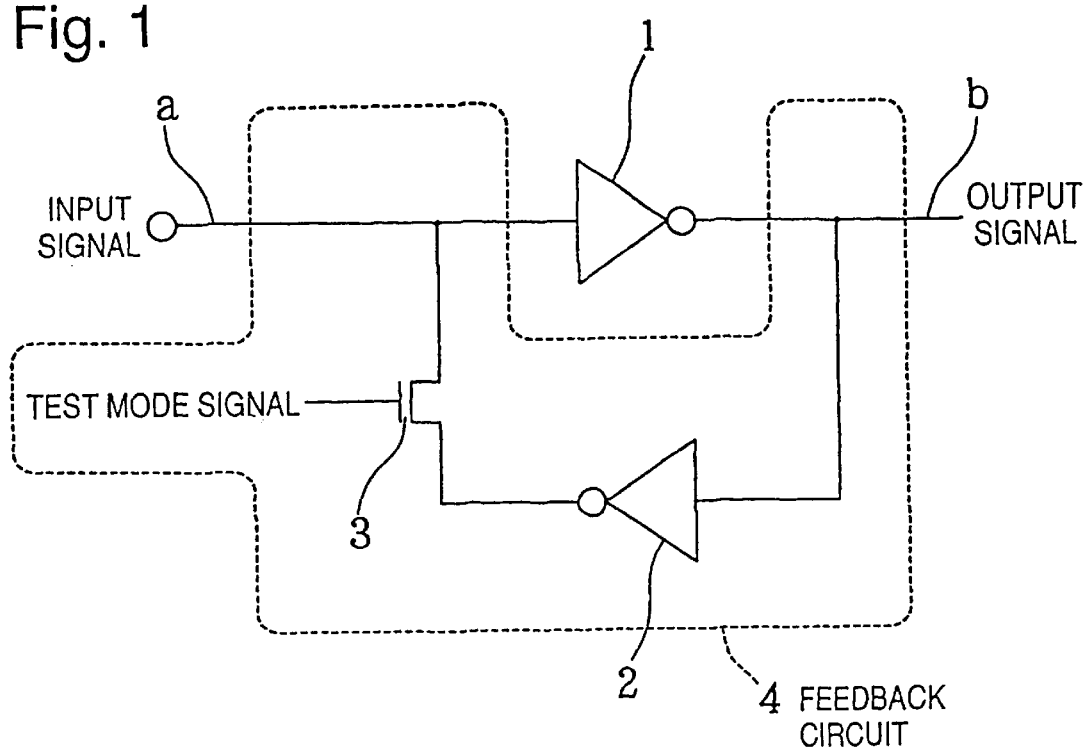
FIG. 1 is a circuit diagram of a first embodiment of the input initial stage circuit in accordance with the present invention for a semiconductor memory.

Referring to FIG. 1, there is shown a circuit diagram of a first embodiment of the input initial stage circuit in accordance with the present invention for a semiconductor memory.

As shown in FIG. 1, the first embodiment of the input initial stage circuit includes an inverter 1 and a feedback circuit 4. The feedback circuit 4 includes another inverter 2 and a switching transistor 3 which is formed of for example a MOS transistor as shown.

Figure 4:
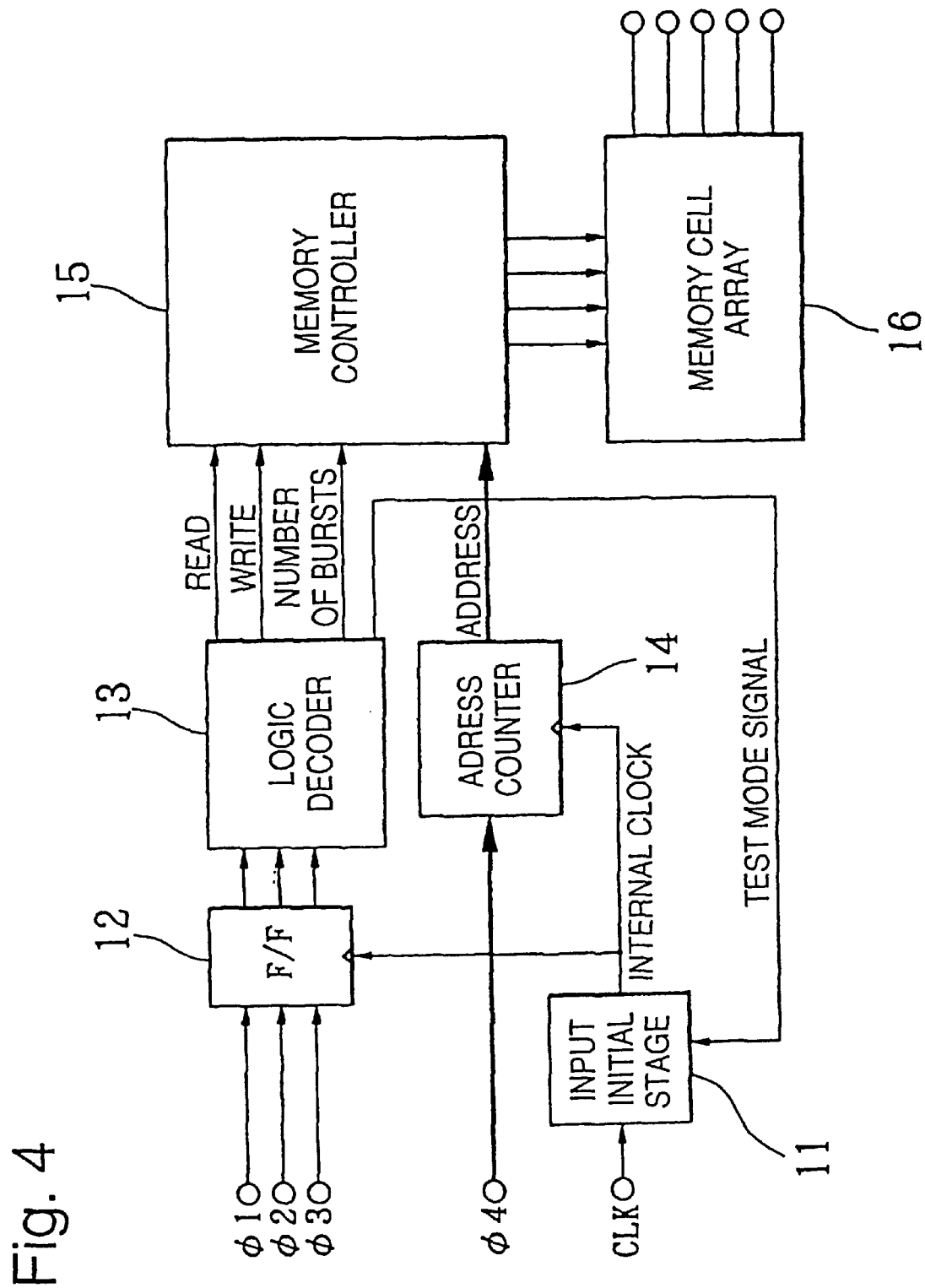
FIG. 4 is a block diagram illustrating a basic construction of the synchronous DRAM incorporating the input initial stage circuit in accordance with the present invention.

The inverter 1 has an input connected to receive an input signal "a" (namely, an external clock CLK as shown in FIG. 4) for outputting an inverted and amplified signal as an output signal "b" (namely, an internal clock "INTERNAL CLOCK" as shown in FIG. 4). The inverter 2 has an input connected to an output of the inverter 1 for outputting an inverted and amplified signal of the output of the inverter 1. An output of the inverter 2 is connected to the input of the inverter 1 through a main current path of the switching transistor 3 (a source-drain path of the MOS transistor). A control electrode of the switching transistor 3 (a gate of the MOS transistor) is connected to receive a test mode signal "TEST MODE SIGNAL" supplied from the logic decoder 13 as shown in FIG. 4. Here, since the other construction of the semiconductor memory shown in FIG. 4 was explained hereinbefore, explanation will be omitted for simplification of the description.

When the test mode signal "TEST MODE SIGNAL" is rendered active, the switching transistor 3 is turned on so that the output of the inverter 2 is connected to the input of the inverter 1, and therefore, the output of the inverter 1 is fed back to the input of the inverter 1 through the inverter 2. On the other hand, when the test mode signal "TEST MODE SIGNAL" is inactive, the switching transistor 3 is maintained in an off condition so that the input of the inverter 1 is isolated from the output of the inverter 2, and therefore, the output of the inverter 1 is not fed back to the input of the inverter 1.

When the output of the inverter 1 is connected to the input of the inverter 2 and the output of the inverter 2 is connected to the input of the inverter 1, a circuit constituted of these inverters 1 and 2 has such a hysteresis characteristics that a threshold of the circuit constituted of the inverters 1 and 2 when an input changes from a low level to a high level is different from a threshold of the circuit constituted of the inverters 1 and 2 when the input changes from the high level to the low level. Now, this hysteresis characteristics will be explained with reference to FIGS. 1A, 1B and 1C.

Figure 1A:
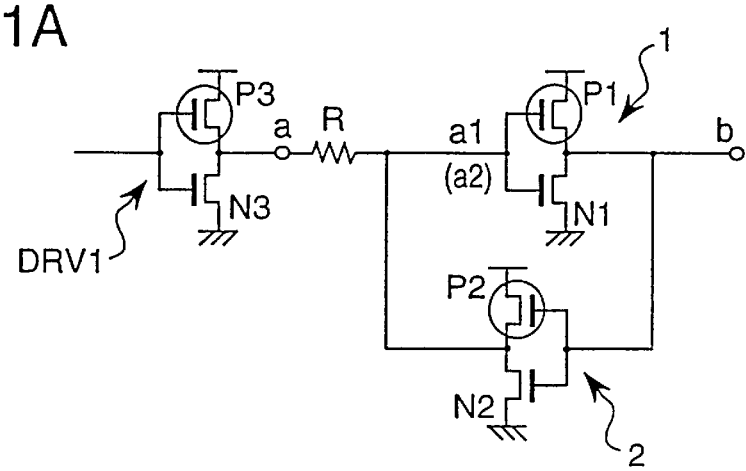
FIG. 1A is a detailed circuit diagram for illustrating an operation principle of the input initial stage circuit shown in FIG. 1.

Referring to FIG. 1A, there is a circuit diagram for illustrating an operation principle of the input initial stage circuit shown in FIG. 1 when the switching transistor 3 is in an on condition.

As shown in FIG. 1A, the inverter 1 is constituted of a PMOS transistor P1 and an NMOS transistor N1 connected as well-known to persons skilled in the art, and the inverter 2 is constituted of a PMOS transistor P2 and an NMOS transistor N2 connected as well-known to persons skilled in the art. A driver of a preceding circuit for supplying the external clock CLK to the input initial stage circuit is designated with "DRV1", and is constituted of a PMOS transistor P3 and an NMOS transistor N3 connected in the form of an inverter as well-known to persons skilled in the art. A wiring resistance from the input "a" of the input initial stage circuit to the input of the inverter 1 is designated with "R". The inverters 1 and 2 have the same threshold "S", and the PMOS transistors P1, P2 and P3 and the NMOS transistors N1, N2 and N3 have the same current driving capability.

When a potential on the input "a" is stable at the low level, the PMOS transistor PI and the NMOS transistors N2 and N3 are on and the PMOS transistors P2 and P3 and the NMOS transistor N1 are off.

Figure 1B:
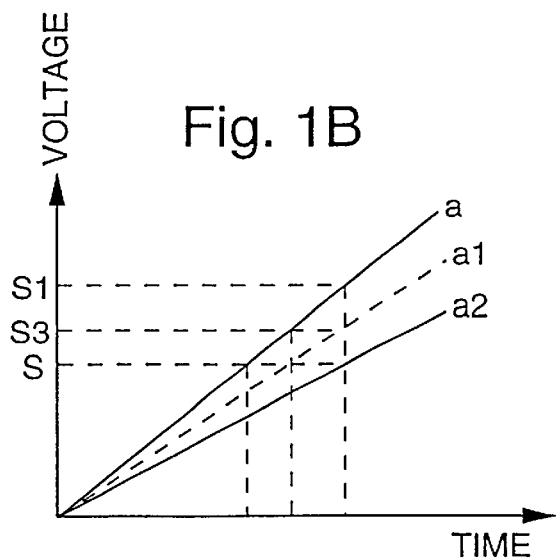
FIGS. 1B and 1C are graphs for illustrating a change of the threshold of the input initial stage circuit shown in FIG. 1A.

In this condition, if the PMOS transistor P3 is turned on and the NMOS transistor N3 is turned off so that the potential on the input "a" of the input initial stage circuit starts to elevate as shown in FIG. 1B, when the potential on the input "a" reaches the threshold "S" of the inverter 1, the actual potential on the input of the inverter 1 has not yet elevated to the threshold "S" of the inverter 1, as shown by "a1" in FIG. 1B, because an electric current flow from the PMOS transistor P3 through the wiring resistance R to the NMOS transistor N2. Therefore, the output of the inverter 1 has not yet changed from the high level to the low level. Thereafter, when the potential on the input of the inverter 1 reaches the threshold "S" of the inverter 1, the output of the inverter 1 actually changes from the high level to the low level. At this time, the potential on the input "a" of the input initial stage circuit has already reached a voltage "S3" which is higher than the threshold "S" of the inverter 1.

On the other hand, when the potential on the input "a" is stable at the high level, the PMOS transistors P2 and P3 and the NMOS transistor N1 are on, and the PMOS transistor P1 and the NMOS transistors N2 and N3 are off.

Figure 1C:
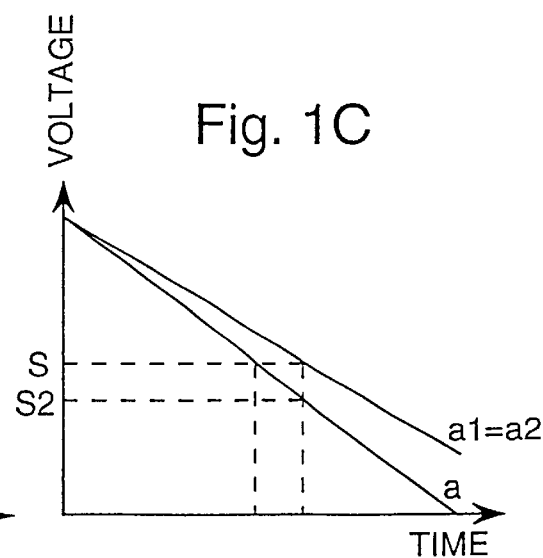

In this condition, if the PMOS transistor P3 is turned off and the NMOS transistor N3 is turned on so that the potential on the input "a" of the input initial stage circuit starts to drop as shown in FIG. 1C, when the potential on the input "a" reaches the threshold "S" of the inverter 1, the actual potential on the input of the inverter 1 has not yet dropped to the threshold "S" of the inverter 1, as shown by "a1" in FIG. 1C, because an electric current flow from the PMOS transistor P2 through the wiring resistance R to the NMOS transistor N3. Therefore, the output of the inverter 1 has not yet changed from the low level to the high level. Thereafter, when the actual potential on the input of the inverter 1 reaches the threshold "S" of the inverter 1, the output of the inverter 1 actually changes from the low level to the high level. At this time, the potential on the input "a" of the input initial stage circuit has already reached a voltage "S2" which is lower than the threshold "S" of the inverter 1.

Thus, the circuit constituted of these inverters 1 and 2 apparently has two thresholds "S3" and "S2". The threshold "S3" of the circuit constituted of the inverters 1 and 2 when the input "a" changes from the low level to the high level becomes higher than the threshold "S2" of the circuit constituted of the inverters 1 and 2 when the input "a" changes from the high level to the low level. Namely, the circuit constituted of these inverters 1 and 2 can have the hysteresis characteristics. This hysteresis characteristics is determined by a ratio of the current driving capability between the preceding driver DRV1 and the inverter 2. For example, the hysteresis characteristics can be enhanced by making the current driving capability of the NMOS transistor N2 larger than that of the PMOS transistor P2, namely, larger than that of the PMOS transistor P3 in the preceding driver DRV1.

In this case, if that the potential on the input "a" of the input initial stage circuit starts to elevate from the low level as shown in FIG. 1B, when the potential on the input "a" reaches the threshold "S3", the actual potential on the input of the inverter 1 has not yet elevated to the threshold "S" of the inverter 1, as shown by "a2" in FIG. 1B, because the current driving capability of the NMOS transistor N2 is larger than that of the PMOS transistor P3 in the preceding driver DRV1. Therefore, the output of the inverter 1 has not yet changed from the high level to the low level. Thereafter, when the actual potential on the input of the inverter 1 reaches the threshold "S" of the inverter 1, the output of the inverter 1 actually changes from the high level to the low level. At this time, the potential on the input "a" of the input initial stage circuit has already reached a voltage "S1" which is higher than the threshold "S" of the inverter 1 and which is also higher than the threshold "S3" when the transistors P1 to P3 and N1 to N3 have the same current driving capability.

On the other hand, if the potential on the input "a" of the input initial stage circuit starts to drop from the high level as shown in FIG. 1C, when the potential on the input "a" drops to the threshold "S2", the potential on the input of the inverter 1 drops to the threshold "S" of the inverter 1, as shown by "a2" in FIG. 1C, because the current driving capability of the PMOS transistor P2 is not changed.

Thus, the threshold "S1" of the circuit constituted of the inverters 1 and 2 when the input "a" changes from the low level to the high level becomes further higher than the threshold "S2" of the circuit constituted of the inverters 1 and 2 when the input "a" changes from the high level to the low level.

Now, assuming that the circuit constituted of these inverters 1 and 2 apparently has the above mentioned thresholds "S1" and "S2", an operation of the input initial stage circuit shown in FIG. 1 will be described with reference to FIG. 2, which is a timing chart for illustrating an operation of the input initial stage circuit shown in FIG. 1.

Figure 5:
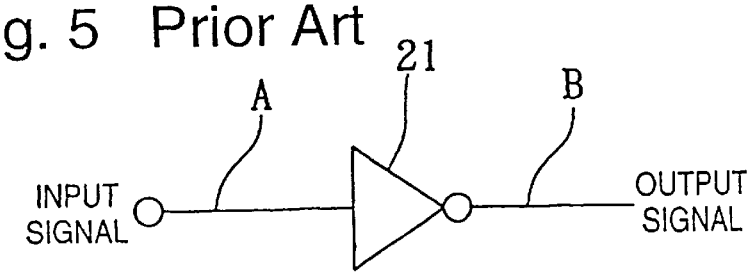
FIG. 5 is a circuit diagram of the prior art input initial stage circuit.

In a normal operation of the semiconductor memory, the test mode signal "TEST MODE SIGNAL" is maintained at a low level, namely, inactive. In this condition, therefore, the switching transistor 3 is maintained in an off condition so that the input of the inverter 1 is isolated from the output of the inverter 2, and therefore, the output of the inverter 1 is not fed back to the input of the inverter 1. Accordingly, the input initial stage circuit shown in FIG. 1 operates similarly to the prior art input initial stage circuit shown in FIG. 5.

In a testing condition, the test mode signal "TEST MODE SIGNAL" is brought to a high level, namely, is rendered active, so that the switching transistor 3 is brought into an on condition. Therefore, the input of the inverter 1 is connected the output of the inverter 2, so that the output of the inverter 1 is fed back to the input of the inverter 1. Thus, the input initial stage circuit shown in FIG. 1 operates as a hysteresis circuit as the whole. Because of the hysteresis characteristics given by the feedback circuit to the input initial stage circuit shown in FIG. 1, the threshold "S2" of the input initial stage circuit when the input of the input initial stage circuit changes from the high level to the low level, is lower than the threshold "S1" of the input initial stage circuit when the input of the input initial stage circuit changes from the low level to the high level, as shown in FIG. 2.

Figure 2:
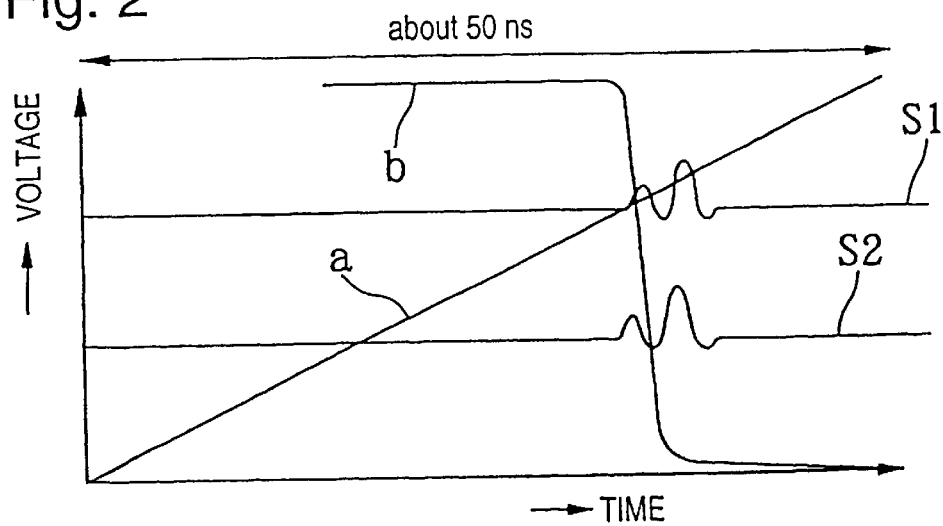
FIG. 2 is a timing chart for illustrating an operation of the input initial stage circuit shown in FIG. 1.
Figure 6:
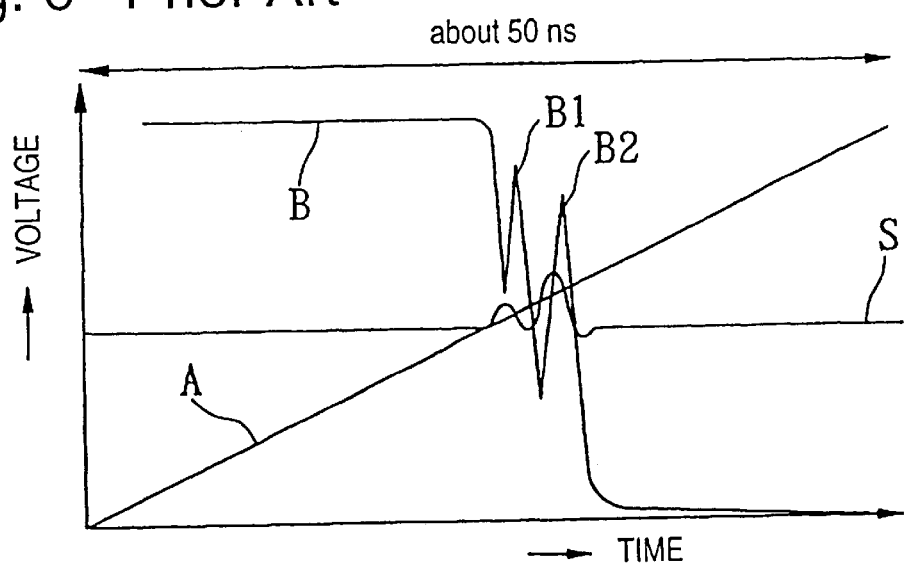
FIG. 6 is a timing chart for illustrating an operation of the input initial stage circuit composed of the inverter as shown in FIG. 5.

Now, when the input signal applied to the input initial stage circuit monotonously increases as indicated with "a" in FIG. 2, an output signal "b" of the input initial stage circuit is constant at a high level unless the level of the input signal "a" exceeds the threshold "S1". When the level of the input signal "a" exceeds the threshold "S1", an electric current flows in the inside of the inverter 1, so that the output voltage "b" of the inverter 1 drops. At this time, although the threshold of the inverter varies because of a power supply voltage variation in the inside of the circuit, and therefore, although the thresholds "S1" and "S2" of the input initial stage circuit vary, or although the voltage on the input "a" varies, since the threshold "S2" (of the input initial stage circuit when the input of the input initial stage circuit changes from the high level to the low level) is sufficiently lower than the threshold "SI" (of the input initial stage circuit when the input of the input initial stage circuit changes from the low level to the high level), the condition that the level of the input signal "a" is higher than the threshold "S2" is maintained, with the result that no parasite signal (formed of the short pulses "B1" and "B2" as shown in FIG. 6) is generated at the output "b" of the input initial stage circuit, and the output signal "b" of the input initial stage circuit monotonously rapidly drops.

Accordingly, even if the input signal (external clock) applied to the input initial stage circuit shown in FIG. 1 has a slow voltage transition, no parasite signal attributable to the power supply voltage variation in the inside of the circuit appears in the output signal "b" of the input initial stage circuit shown in FIG. 1. Namely, no voltage variation attributable to the parasite signal is superposed on the output signal "b" of the input initial stage circuit shown in FIG. 1.

As mentioned above, in the input initial stage circuit shown in FIG. 1, at the time for testing the semiconductor memory, the second inverter 2 is connected to the first inverter 1 receiving and amplifying the input signal (the external clock) in such a manner that the output of the first inverter is fed back to the input of the first inverter through the second inverter, with the result that the input initial stage circuit operates as a hysteresis circuit. Therefore, when the level of the input signal exceeds the threshold of the hysteresis circuit, it is possible to prevent the generation of the parasite signal (formed of the short pulses "B1" and "B2" caused by the threshold variation attributable to the internal power supply voltage noise). Accordingly, although a test signal generated in a testing apparatus for testing the semiconductor memory is very slow in voltage transition, the input initial stage circuit can generates an internal signal which correctly reflects the change of the test signal with including no parasite signal, with the result that it is possible to normally verify the operation of the semiconductor memory.

Figure 3:
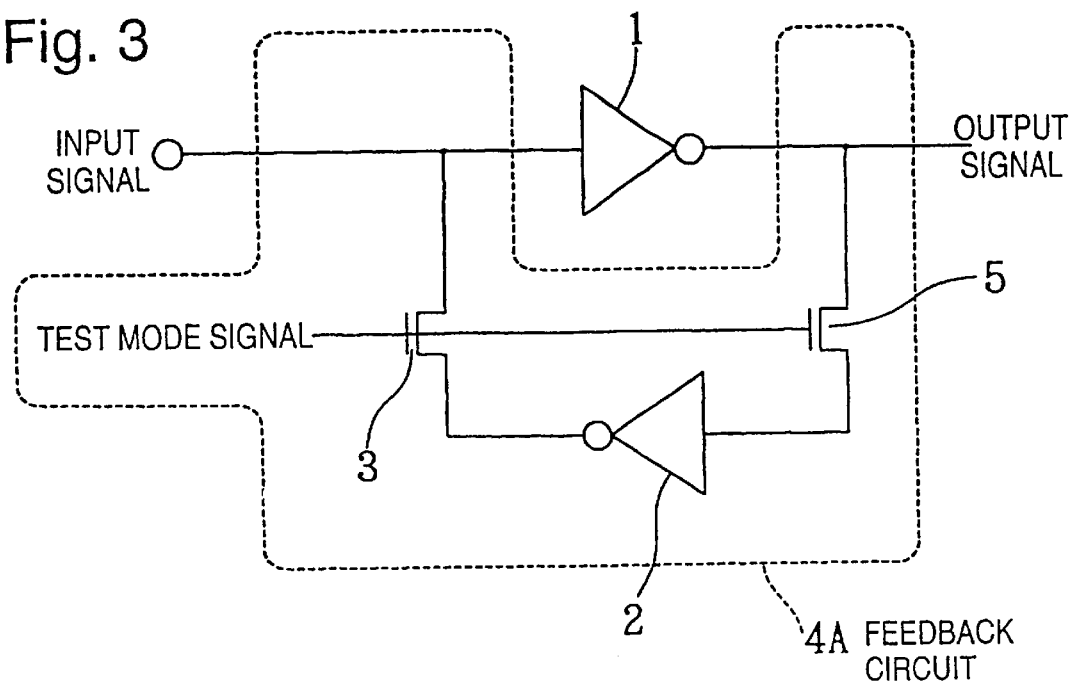
FIG. 3 is a circuit diagram of a second embodiment of the input initial stage circuit in accordance with the present invention for a semiconductor memory.

Referring to FIG. 3, there is shown a circuit diagram of a second embodiment of the input initial stage circuit in accordance with the present invention for a semiconductor memory. In FIG. 3, elements corresponding to those shown in FIG. 1 are given the same reference numbers, and explanation will be omitted for simplification of the description.

As shown in FIG. 3, the second embodiment of the input initial stage circuit includes the inverter 1 and a feedback circuit 4A. The feedback circuit 4A includes the second inverter 2 and the first switching transistor 3 and a second switching transistor 5 both of which is formed of for example a MOS transistor as shown. As seen form comparison between FIG. 1 and FIG. 3, the second embodiment is different from the first embodiment only in that the second switching transistor 5 having a control electrode connected to receive the test mode signal "TEST MODE SIGNAL" is inserted between the output of the inverter 1 and the input of the inverter 2. Therefore, when the test mode signal "TEST MODE SIGNAL" is rendered active, the switching transistors 3 and 5 are turned on so that the output of the inverter 1 is connected to the input of the inverter 2 and the output of the inverter 2 is connected to the input of the inverter 1, so that the output of the inverter 1 is fed back to the input of the inverter 1 through the inverter 2. On the other hand, when the test mode signal "TEST MODE SIGNAL" is inactive, the switching transistors 3 and 5 are maintained in an off condition so that the output of the inverter 1 is isolated from the input of the inverter 2 and the input of the inverter 1 is isolated from the output of the inverter 2, with the result that the output of the inverter 1 is not fed back to the input of the inverter 1.

Now, an operation of the input initial stage circuit shown in FIG. 3 will be described.

In a normal operation of the semiconductor memory, the test mode signal "TEST MODE SIGNAL" is maintained at a low level, namely, inactive. In this condition, since the switching transistors 3 and 5 are maintained in an off condition, the output of the inverter 1 is isolated from the input of the inverter 2 and the input of the inverter 1 is isolated from the output of the inverter 2, so that the output of the inverter I is not fed back to the input of the inverter 1. Therefore, the input initial stage circuit shown in FIG. 3 operates similarly to the prior art input initial stage circuit shown in FIG. 5.

On the other hand, in a testing condition, the test mode signal "TEST MODE SIGNAL" is brought to a high level, namely, is rendered active, so that the switching transistors 3 and 5 are brought into an on condition. Therefore, the output of the inverter 1 is connected to the input of the inverter 2 and the output of the inverter 2 is connected to the input of the inverter 1, so that the output of the inverter 1 is fed back to the input of the inverter 1. Thus, the input initial stage circuit shown in FIG. 3 operates as a hysteresis circuit as the whole. Therefore, when the test mode signal "TEST MODE SIGNAL" is brought to the high level, the input initial stage circuit shown in FIG. 3 operates similarly to the input initial stage circuit shown in FIG. 1, and therefore, further explanation will be omitted.

In the second embodiment, in addition, since the switching transistor 5 is maintained in the off condition in the normal operation of the semiconductor memory, the output of the inverter 1 is isolated from the input of the inverter 2. As a result, it is possible to prevent an input capacitance of the second inverter from being added to the output of the first inverter. Accordingly, the input initial stage circuit can realize an operation speed higher than that obtained in the first embodiment.

As mentioned above, in the input initial stage circuit shown in FIG. 3, at the time for testing the semiconductor memory, the second inverter 2 is connected to the first inverter 1 receiving and amplifying the input signal (the external clock) in such a manner that the output of the first inverter is fed back to the input of the first inverter through the second inverter, with the result that the input initial stage circuit operates as a hysteresis circuit. Therefore, when the level of the input signal exceeds the threshold of the hysteresis circuit, it is possible to prevent the generation of the parasite signal (formed of the short pulses "B1" and "B2" caused by the threshold variation attributable to the internal power supply voltage noise). Accordingly, although a test signal generated in a testing apparatus for testing the semiconductor memory is very slow in voltage transition, the input initial stage circuit can generates an internal signal which correctly reflects the change of the test signal with including no parasite signal, with the result that it is possible to normally verify the operation of the semiconductor memory.

In addition, the second switching means (formed of the switching transistor) is inserted between the output of the first inverter 1 receiving and amplifying the input signal (the external clock) and the input of the second inverter 2 constituting the feedback circuit, and the second switching means is maintained in the off condition in the normal operation of the semiconductor memory, so that the output of the first inverter 1 is separated from the input of the second inverter 2. Therefore, it is possible to prevent the input capacitance of the second inverter 2 (constituting the feedback circuit) from being added to the output of the first inverter 1. Accordingly, the input initial stage circuit can realize an operation speed higher than that obtained in the first embodiment.

The invention has thus been shown and described with reference to the specific embodiments. However, it should be noted that the present invention is in no way limited to the details of the illustrated structures but changes and modifications may be made within the scope of the appended claims. For example, the input initial stage circuit is in no way limited to only the inverter, but can be formed of a current mirror circuit. In addition, the input initial stage circuit in accordance with the present invention for the semiconductor memory is in no way limited to only the synchronous DRAM, but can be applied to conventional DRAMs and various read only semiconductor memories having the burst operation function and the internal address count-up function.

As seen from the above, in the input initial stage circuit in accordance with the present invention for the semiconductor memory, when the semiconductor memory is tested, the output of the inverter receiving and amplifying the input signal (the external clock) is fed back to the input of the same inverter so that the input initial stage circuit operates as a hysteresis circuit. Therefore, when the level of the input signal exceeds the threshold of the hysteresis circuit, it is possible to prevent the generation of the parasite signal formed of the short pulses, caused by the threshold variation attributable to the internal power supply voltage noise. Accordingly, although a test signal generated in a memory simple testing apparatus used in a fabricating process for sorting and evaluating the semiconductor memories is very slow in voltage transition, the input initial stage circuit can generates an internal signal which correctly reflects the change of the test signal with including no parasite signal, with the result that it is possible to normally verify the operation of the semiconductor memory.

In addition, when the switching means is inserted between the output of the inverter receiving and amplifying the input signal (the external clock) and the input of the inverter constituting the feedback circuit, if the switching means is maintained in the off condition in the normal operation of the semiconductor memory, the output of the inverter for receiving and amplifying the input signal is separated from the input of the feedback inverter in the normal operation of the semiconductor memory. Therefore, it is possible to prevent an input capacitance of the feedback inverter from being added to the output of the inverter receiving and amplifying the input signal. Accordingly, the input initial stage circuit can realize a high speed operation. For example, if the input initial stage circuit in accordance with the present invention is incorporated in the semiconductor memory, the operation of the semiconductor memory having an operation frequency of not less than 166 MHz (an operation speed of not greater than 6 ns) can be verified with a memory simple testing apparatus supplying an external clock having a voltage transition time of about 50 ns, and therefore, a new capital investment is no longer necessary for a variety of kinds of products.

What is claimed is:

1. An input initial stage circuit for a semiconductor memory which includes the input initial stage circuit receiving an external clock for generating an internal clock and an internal circuit operating on the basis of the internal clock, the input initial stage circuit comprising a first inverter receiving the external clock for generating the internal clock, a second inverter receiving an output of said first inverter, and a switch means connected between an output of said second inverter and an input of said first inverter, said switch means being turned on at the time of a testing, so as to connect said output of said second inverter to said input of said first inverter.

2. An input initial stage circuit claimed in claim 1 wherein said switch means comprises a transistor having a control electrode receiving a test mode signal and a main current path connected between said output of said second inverter and said input of said first inverter, said transistor being turned on in response to said test mode signal, so as to connect said output of said second inverter to said input of said first inverter.

3. An input initial stage circuit claimed in claim 2 wherein said external clock applied at the time of said testing has a voltage transition which is slower than a voltage transition of an external clock applied in a normal operation of the semiconductor memory.

4. An input initial stage circuit claimed in claim 2 wherein said semiconductor memory comprises an internal address count-up function counting up said internal clock for generating an address, an operation mode setting function responding to an external command latched in response to said internal clock, for setting a mode for a reading or a writing, and a burst operation function responding to said external command latched in response to said internal clock for setting the number of bursts to be performed from a designated address, for a burst reading or writing.

5. An input initial stage circuit claimed in claim 1 wherein said external clock applied at the time of said testing has a voltage transition which is slower than a voltage transition of an external clock applied in a normal operation of the semiconductor memory.

6. An input initial stage circuit claimed in claim 1 wherein said semiconductor memory comprises an internal address count-up function counting up said internal clock for generating an address, an operation mode setting function responding to an external command latched in response to said internal clock, for setting a mode for a reading or a writing, and a burst operation function responding to said external command latched in response to said internal clock, for setting the number of bursts to be performed from a designated address for a burst reading or writing.

7. An input initial stage circuit for a semiconductor memory which includes the input initial stage circuit receiving an external clock for generating an internal clock and an internal circuit operating on the basis of the internal clock, the input initial stage circuit comprising a first inverter receiving the external clock for generating the internal clock, a second inverter receiving an output of said first inverter, a first switch means connected between an output of said second inverter and an input of said first inverter, said first switch means being turned on at the time of a testing, so as to connect said output of said second inverter to said input of said first inverter, and a second switch means connected between said output of said first inverter and an input of said second inverter, said second switch means being turned on at the time of said testing, so as to connect said output of said first inverter to said input of said second inverter.

8. An input initial stage circuit claimed in claim 7 wherein said first switch means comprises a first transistor having a control electrode receiving a test mode signal and a main current path connected between said output of said second inverter and said input of said first inverter, said first transistor being turned on in response to said test mode signal, so as to connect said output of said second inverter to said input of said first inverter, and wherein said second switch means comprises a second transistor having a control electrode receiving said test mode signal and a main current path connected between said output of said first inverter and said input of said second inverter, said second transistor being turned on in response to said test mode signal, so as to connect said output of said first inverter to said input of said second inverter.

9. An input initial stage circuit claimed in claim 8 wherein said external clock applied at the time of said testing has a voltage transition which is slower than a voltage transition of an external clock applied in a normal operation of the semiconductor memory.

10. An input initial stage circuit claimed in claim 8 wherein said semiconductor memory comprises an internal address count-up function counting up said internal clock for generating an address, an operation mode setting function responding to an external command latched in response to said internal clock, for setting a mode for a reading or a writing, and a burst operation function responding to said external command latched in response to said internal clock, for setting the number of bursts to be performed from a designated address for a burst reading or writing.

11. An input initial stage circuit claimed in claim 7 wherein said external clock applied at the time of said testing has a voltage transition which is slower than a voltage transition of an external clock applied in a normal operation of the semiconductor memory.

12. An input initial stage circuit claimed in claim 7 wherein said semiconductor memory comprises an internal address count-up function counting up said internal clock for generating an address, an operation mode setting function responding to an external command latched in response to said internal clock, for setting a mode for a reading or a writing, and a burst operation function responding to said external command latched in response to said internal clock, for setting the number of bursts to be performed from a designated address for a burst reading or writing.

13. An input initial stage circuit for a semiconductor memory which includes the input initial stage circuit receiving an external clock for generating an internal clock and an internal circuit operating on the basis of the internal clock, the input initial stage circuit comprising a feedback circuit so that the input initial stage circuit operates as a hysteresis circuit, so as to prevent generation of a parasitic signal in said internal clock, attributable to variation of a threshold occurring when the level of the external clock exceeds the threshold of the input initial stage circuit.

14. An input initial stage circuit claimed in claim 13 wherein the input initial stage circuit comprises a first inverter receiving the external clock for generating the internal clock, a second inverter receiving an output of said first inverter, and a switch means connected between an output of said second inverter and an input of said first inverter, said switch means being turned on at the time of a testing, so as to connect said output of said second inverter to said input of said first inverter.

15. An input initial stage circuit claimed in claim 14 wherein said switch means comprises a transistor having a control electrode receiving a test mode signal and a main current path connected between said output of said second inverter and said input of said first inverter, said transistor being turned on in response to said test mode signal, so as to connect said output of said second inverter to said input of said first inverter.

16. An input initial stage circuit claimed in claim 13 wherein the input initial stage circuit comprises a first inverter receiving the external clock for generating the internal clock, a second inverter receiving an output of said first inverter, a first switch means connected between an output of said second inverter and an input of said first inverter, said first switch means being turned on at the time of a testing, so as to connect said output of said second inverter to said input of said first inverter, and a second switch means connected between said output of said first inverter and an input of said second inverter, said second switch means being turned on at the time of said testing, so as to connect said output of said first inverter to said input of said second inverter.

17. An input initial stage circuit claimed in claim 16 wherein said first switch means comprises a first transistor having a control electrode receiving a test mode signal and a main current path connected between said output of said second inverter and said input of said first inverter, said first transistor being turned on in response to said test mode signal, so as to connect said output of said second inverter to said input of said first inverter, and wherein said second switch means comprises a second transistor having a control electrode receiving said test mode signal and a main current path connected between said output of said first inverter and said input of said second inverter, said second transistor being turned on in response to said test mode signal, so as to connect said output of said first inverter to said input of said second inverter.

* * * * *